(12) United States Patent
Schooley et al.

(10) Patent No.: US 9,035,701 B2
(45) Date of Patent: May 19, 2015

(54) THERMALLY COUPLED CURRENT LIMITER

(75) Inventors: Derek Schooley, Oak Ridge, NC (US);
Robert Bennett, Greensboro, NC (US);
James Leake, Summerfield, NC (US);
Pradeep Silva, San Diego, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 39 days.

(21) Appl. No.: 13/593,067

(22) Filed: Aug. 23, 2012

(65) Prior Publication Data

US 2013/0049871 A1 Feb. 28, 2013

Related U.S. Application Data

(60) Provisional application No. 61/527,868, filed on Aug. 26, 2011.

(51) Int. Cl.
*H02H 9/02* (2006.01)
*H03F 3/04* (2006.01)
*H03F 1/02* (2006.01)
*H03F 3/19* (2006.01)
*H03F 3/21* (2006.01)

(52) U.S. Cl.
CPC ............... *H03F 1/0272* (2013.01); *H03F 3/19* (2013.01); *H03F 3/21* (2013.01); *H03F 2200/462* (2013.01)

(58) Field of Classification Search
USPC .............. 330/285, 296, 298, 207 P, 289, 256, 330/266, 272
See application file for complete search history.

(56) References Cited

U.S. PATENT DOCUMENTS

| 7,948,317 B2 * | 5/2011 | Wan ............................. 330/277 |
| 8,385,854 B2 * | 2/2013 | Hadjichristos et al. ....... 455/117 |

* cited by examiner

*Primary Examiner* — Hieu Nguyen
(74) *Attorney, Agent, or Firm* — Withrow & Terranova, P.L.L.C.

(57) ABSTRACT

This disclosure relates generally to radio frequency (RF) amplification devices and methods of limiting an RF signal current. Embodiments of the RF amplification device include an RF amplification circuit and a feedback circuit. The RF amplification circuit is configured to amplify an RF input signal so as to generate an amplified RF signal that provides an RF signal current with a current magnitude. The feedback circuit is used to limit the RF signal current. In particular, a thermal sense element in the feedback circuit is configured to generate a sense current, and thermal conduction from the RF amplification circuit sets a sense current level of the sense current as being indicative of the current magnitude of the RF signal current. To limit the RF signal current, the feedback circuit decreases the current magnitude of the RF signal current in response to the sense current level reaching a trigger current level.

27 Claims, 9 Drawing Sheets

THERMALLY COUPLED CURRENT LIMITER

RELATED APPLICATIONS

This application claims the benefit of provisional patent application Ser. No. 61/527,868, filed Aug. 26, 2011, the disclosure of which is hereby incorporated herein by reference in its entirety.

FIELD OF THE DISCLOSURE

This disclosure relates generally to radio frequency (RF) amplification devices and methods of limiting an RF signal current.

BACKGROUND

In radio frequency (RF) front-end modules, RF amplification devices provide amplification to RF signals. For example, an RF input signal in a transmission chain or a receiver chain in the front-end module may be amplified for further processing by downstream RF circuitry. Under ideal conditions, the RF amplification device may be provided so that a source impedance presented to downstream RF circuitry matches a load impedance presented by the downstream RF circuitry to the RF amplification device. This minimizes power dissipation at the RF amplification device and maximizes power transfer.

However, RF amplification devices often have to operate in less than ideal conditions. For example, the load impedance presented by the downstream RF circuitry may experience fluctuations, thereby resulting in excessive power dissipation by the RF amplification device and/or excessive signal levels that may damage the RF amplification device. Accordingly, to prevent excessive power dissipation and/or signal levels that may damage the RF amplification device, there is a need to limit the RF signal current generated by the RF amplification device.

Unfortunately, current limiting circuitry used to limit current in RF amplification devices is often complex. As a result, the current limiting circuitry may make the RF amplification device more expensive to manufacture. The complexity of the current limiting circuitry may also hinder performance. For example, this complexity may affect how fast the current limiting circuitry can respond and/or the degree to which the current limiting circuitry can limit the RF signal current. Therefore, there is a need for methods and circuitry that employ simpler techniques for limiting the RF signal current and/or can provide a higher degree of current limiting.

SUMMARY

This disclosure relates generally to radio frequency (RF) amplification devices and methods of limiting an RF signal current. Each embodiment of the RF amplification devices discussed herein includes an RF amplification circuit and a feedback circuit. The RF amplification circuit is configured to amplify an RF input signal so as to generate an amplified RF signal. The RF signal current is provided by the amplified RF signal with a current magnitude.

The feedback circuit of the RF amplification device helps to prevent or reduce overshoot of the RF signal current provided by the amplified RF signal. In particular, the feedback circuit has a thermal sense element configured to generate a sense current having a sense current level. Thermal conduction from the RF amplification circuit provides feedback to the thermal sense element, since the RF amplification circuit is heated in accordance with the current magnitude of the RF signal current. The thermal sense element is positioned such that the thermal conduction sets the sense current level of the sense current as being indicative of the current magnitude of the RF signal current. As such, a feedback signal is not required by the feedback circuit from the RF amplification circuit.

The thermal sense element is also positioned such that the sense current level reaches a trigger current level of the feedback circuit in response to the current magnitude of the RF signal current being above a current magnitude limit. The feedback circuit is operable to decrease the current magnitude to or below the current magnitude limit in response to the sense current level of the sense current reaching the trigger current level. In this manner, the feedback circuit limits the RF signal current provided by the amplified RF signal.

Additionally, embodiments for limiting an RF signal current are disclosed. In one exemplary embodiment, an RF input signal is amplified so as to generate an amplified RF signal that provides the RF signal current with a current magnitude and heat in accordance with the current magnitude of the RF signal current. A sense current having a sense current level is generated. The sense current level of the sense current is set such that thermal conduction sets the sense current level of the sense current, and such that the sense current level reaches a trigger current level in response to the current magnitude of the RF signal current being above a current magnitude limit. The current magnitude is decreased to or below the current magnitude limit in response to the sense current level of the sense current reaching the trigger current level. In this manner, current limiting of the RF signal current is provided.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The disclosure relates generally to radio frequency (RF) amplification devices and methods of limiting an RF signal current. The RF amplification device may provide an amplified RF signal to downstream RF circuitry, such as antenna tuners, antennas, filters, analog-to-digital circuitry, power regulation circuitry, and/or the like. For example, user communications devices (such as cell phones, laptops, GPS devices, etc.) often come equipped with front-end modules that process an RF input signal. The RF amplification device provides an amplified RF signal, which can be processed by downstream RF circuitry in the front-end module. However, the RF amplification device is often required to operate in less than ideal conditions. For instance, the impedance presented by the downstream RF circuitry to the RF amplification device may fluctuate. In turn, this may result in current increases that result in the RF amplification device dissipating too much power and/or power at a level which may damage the RF amplification device. As such, the RF amplification devices disclosed herein are configured to limit the RF signal current provided by the amplified RF signal.

Figure 1:
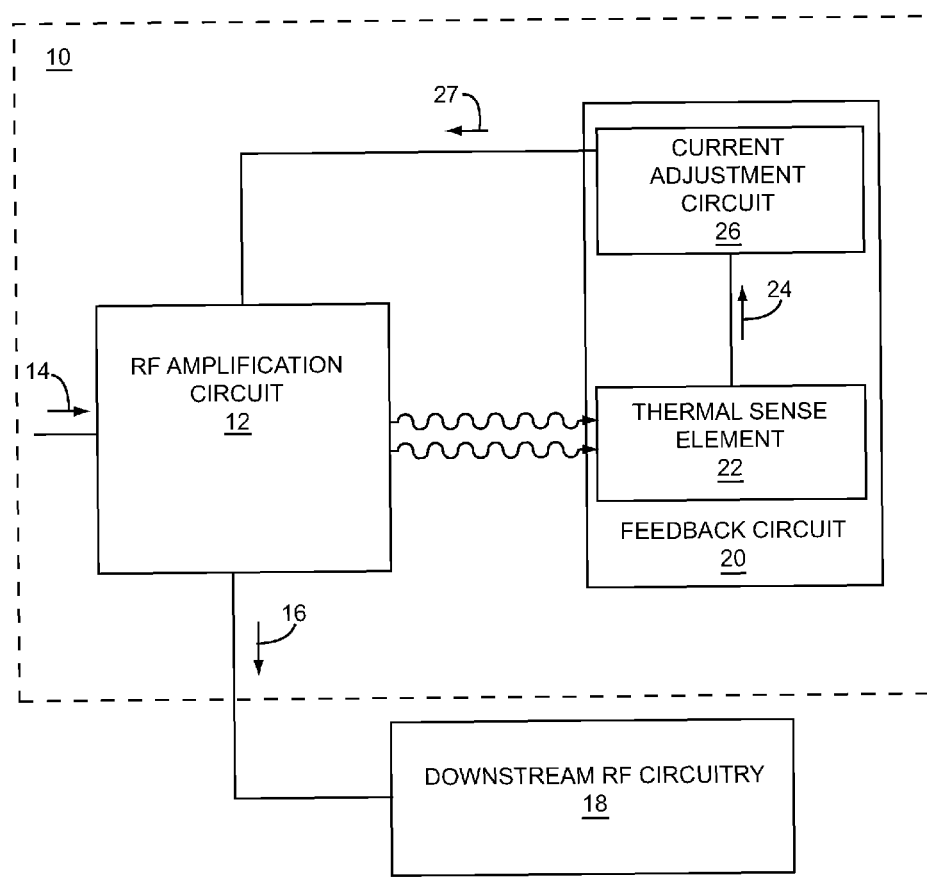
FIG. 1 illustrates an embodiment of a radio frequency (RF) amplification device that includes an RF amplification circuit and a feedback circuit, wherein the RF amplification circuit generates an amplified RF signal that provides an RF signal current and a feedback circuit having a thermal sense element that generates a sense current with a sense current level.

FIG. 1 illustrates a block diagram of one embodiment of an RF amplification device 10. The RF amplification device 10 includes an RF amplification circuit 12 configured to amplify an RF input signal 14 so as to generate an amplified RF signal 16. Since the RF input signal 14 is being amplified to generate the amplified RF signal 16, the amplified RF signal 16 provides an RF signal current which varies at an RF frequency. Accordingly, a current level of the RF signal current is not constant, but rather oscillates. As such, the RF signal current of the amplified RF signal 16 is provided with a current magnitude and a phase. If the current magnitude and phase are known, a current level of the RF signal current may be described as a function of time.

The RF amplification circuit 12 shown in FIG. 1 is coupled to downstream RF circuitry 18. For example, if the RF amplification circuit 12 is provided within a transmission chain of an RF front-end module, the downstream RF circuitry 18 may be an antenna tuner and an antenna. The RF amplification circuit 12 may amplify the RF input signal 14 to generate the amplified RF signal 16. For instance, the RF input signal 14 may be amplified in accordance with an amplification gain of the RF amplification circuit 12. As such, the amplified RF signal 16 may be a version of the RF input signal 14 with an increased power level. The amplification gain provided by the RF amplification circuit 12 enables the amplified RF signal 16 to be transmitted by the antenna after attenuation by the antenna tuner. Accordingly, the downstream RF circuitry 18 (in this example, the antenna and the antenna tuner) may present an impedance to the RF amplification circuit 12.

The RF amplification circuit 12 may be designed to match the impedance presented by the downstream RF circuitry 18 to maximize power transfer. However, the impedance of the downstream RF circuitry 18 and/or the RF amplification circuit 12 may vary due to non-ideal conditions. These non-ideal conditions therefore result in power inefficiencies in which the RF amplification circuit 12 dissipates additional power. To ensure that the power consumption of the RF amplification circuit 12 does not reach unacceptable levels, a feedback circuit 20 is provided. The feedback circuit 20 is operable to decrease the current magnitude of the amplified RF signal 16 to or below a current magnitude limit. However, unlike typical feedback circuits utilized to limit current in an RF amplifier, the feedback circuit 20 shown in FIG. 1 is not electrically coupled to receive a feedback signal that is indicative of the current magnitude of the RF signal current from the RF amplification circuit 12.

Instead, the feedback circuit 20 shown in FIG. 1 has a thermal sense element 22 configured to generate a sense current 24 having a sense current level. Since the RF amplification circuit 12 generates heat when generating the amplified RF signal 16, the RF amplification circuit 12 is heated in accordance with the current magnitude of the RF signal current provided by the amplified RF signal 16. When the current magnitude of the RF signal current goes up, the RF amplification circuit 12 gets hotter and consumes more power. On the other hand, when the current magnitude of the RF signal current goes down, the RF amplification circuit 12 gets cooler and consumes less power. As such, thermal conduction from the RF amplification circuit 12 is related to the current magnitude of the RF signal current provided by the amplified RF signal 16. In particular, this thermal conduction is what provides feedback to the feedback circuit 20. Accordingly, a feedback signal from the RF amplification circuit 12 is not needed by the feedback circuit 20 to indicate the current magnitude of the RF signal current.

To obtain the feedback from the RF amplification circuit 12, the thermal sense element 22 is positioned such that the thermal conduction from the RF amplification circuit 12 sets the sense current level of the sense current 24 as being indicative of the current magnitude of the RF signal current. For example, if the RF amplification circuit 12 gets hotter and the thermal conduction from the RF amplification circuit 12 increases, the sense current level of the sense current 24 may be increased by an amount that is indicative of the increase in the thermal conduction. In contrast, if the thermal conduction decreases due to the RF amplification circuit 12 getting cooler, the sense current level of the sense current 24 may be decreased by an amount indicative of the drop in the current magnitude of the RF signal current provided by the amplified RF signal 16. The thermal sense element 22 may also be positioned such that the sense current level of the sense current 24 reaches a trigger current level of the feedback circuit in response to the current magnitude of the RF signal current being above a current magnitude limit.

Note that the current magnitude of the RF signal current provided by the amplified RF signal 16 is not indicative of the RF signal current at any particular instant in time, but rather describes the level of the oscillating RF signal current. Accordingly, the current magnitude is a magnitude of the RF signal current over some interval of time. There are various manners of describing the current magnitude of the RF signal current provided by the amplified RF signal 16. In one example, the current magnitude may be a root mean squared (RMS) current magnitude. However, there are other ways of describing the current magnitude of an oscillating RF signal current. Regardless of what physical parameter is used to describe the current magnitude of the RF signal current, the point is that the RF amplification circuit 12 will dissipate current and thereby be heated in accordance with the current magnitude of the RF signal current. The thermal sense element 22 may not be configured to adjust the sense current level of the sense current 24 as fast as the RF amplification circuit 12 can adjust the current level of the RF signal current provided by the amplified RF signal 16. Still, the thermal conduction from the RF amplification circuit 12 does indicate increases in the RF signal current over time, such as over a time interval. As such, as the current magnitude goes up, so will the thermal conduction to the thermal sense element 22. Thus, while the sense current level of the sense current 24 may reach the trigger current level in response to the current magnitude of the RF signal current being above the current magnitude limit, there may be a delay in the sense current level reflecting this increase, as the increase in thermal conduction must heat the thermal sense element 22 sufficiently in order for the sense current level to reflect this change.

The feedback circuit 20 is operable to decrease the current magnitude to or below the current magnitude limit in response to the sense current level of the sense current 24 reaching the trigger current level. In this embodiment, the feedback circuit 20 includes a current adjustment circuit 26 that receives the sense current 24 from the thermal sense element 22. The current adjustment circuit 26 is operable to adjust a current control signal 27 in order to decrease the current magnitude to or below the current magnitude limit. As explained in further detail below, the current adjustment circuit 26 may be a bias level generation circuit, an attenuation control circuit, or an amplifier gain adjustment circuit. In fact, the current adjustment circuit 26 may be any type of circuit that can be utilized to adjust the current magnitude of the RF signal current provided by the amplified RF signal 16. Also, as explained in further detail below, in other embodiments, the feedback circuit 20 may only have the thermal sense element 22, wherein the thermal sense element 22 is configured to decrease the current magnitude of the RF signal current provided by the amplified RF signal 16.

In this embodiment, the current adjustment circuit 26 is configured to receive the sense current 24 and decrease the current magnitude of the RF signal current in response to the sense current level of the sense current 24 reaching the trigger current level. The feedback circuit 20 provides a feedback loop in which feedback is received as the thermal conduction from the RF amplification circuit 12 and provides the current control signal 27 as output.

Figure 2:
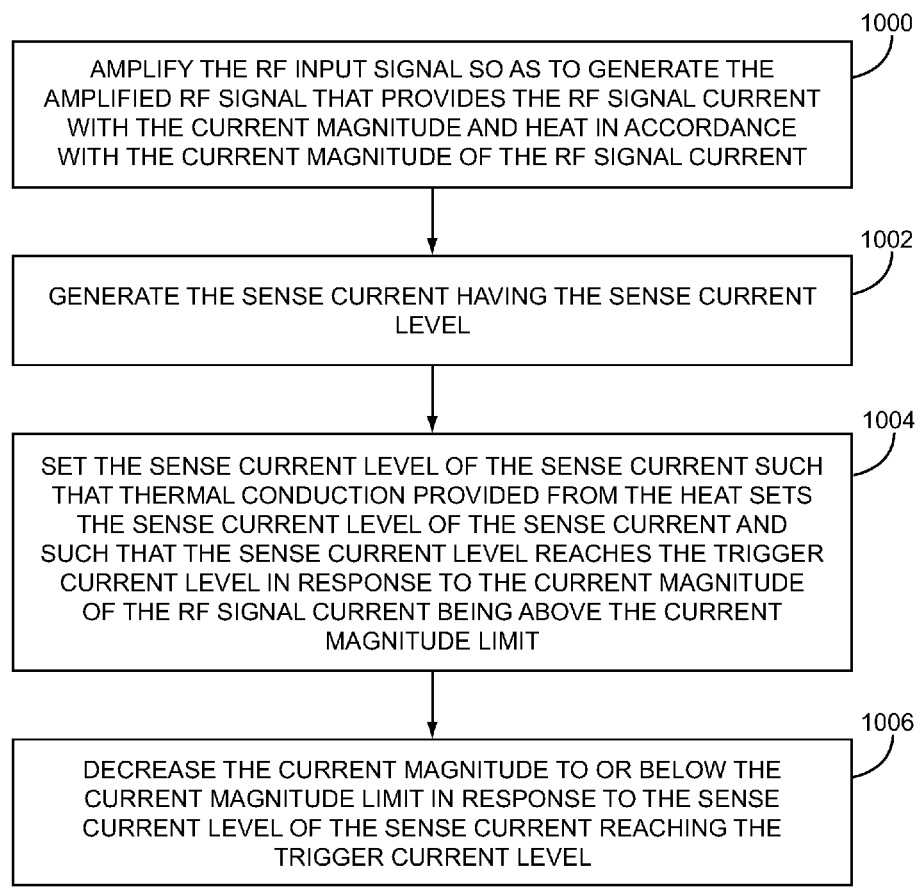
FIG. 2 illustrates exemplary procedures in one embodiment of a method that limits the RF signal current.

FIG. 2 illustrates exemplary procedures that may be implemented in one embodiment of a method of limiting the RF signal current provided by the amplified RF signal 16. The procedures shown in FIG. 2 are implemented by the RF amplification device 10 shown in FIG. 1. Other implementations of the procedures may be performed by alternative embodiments of the RF amplification device 10 and/or the like. Furthermore, it should be noted that the procedures may or may not be implemented in the order described in FIG. 2. For instance, one or more of the procedures may be implemented simultaneously with other described procedures in FIG. 2. The order of the procedures described in FIG. 2 has been selected simply to assist in describing the concepts related to the method and should not be read as requiring any type of sequence.

In procedure 1000, shown in FIG. 2, the RF amplification circuit 12 amplifies the RF input signal 14 so as to generate the amplified RF signal 16 that provides the RF signal current with the current magnitude and heat in accordance with the current magnitude of the RF signal current. In the example described above, the RF input signal 14 is an RF transmission signal. Alternatively, the RF input signal 14 may be an RF receive signal within an RF receiver chain of a front-end module. The RF input signal 14 may need to be amplified for further processing by the receiver chain or transmission chain of the front-end module. The RF input signal 14 may also be filtered prior to being received by the RF amplification circuit 12.

The RF amplification circuit 12 may include several amplification stages cascoded with one another to amplify the RF input signal 14 and generate the amplified RF signal 16 that provides the RF signal current with the current magnitude. Generally, the higher the current magnitude of the RF signal current, the more heat is produced by the RF amplification circuit 12. In one embodiment, the RF amplification circuit 12 is configured to be heated in accordance with the current magnitude, such that a temperature of the RF amplification circuit 12 is substantially directly proportional to the current magnitude. Thus, except for the temperature of the RF amplification circuit 12, the parameters that set the current magnitude may be substantially constant (at least relative to RF frequencies).

Next, the thermal sense element 22 generates the sense current 24 having the sense current level (procedure 1002). The thermal sense element 22 provides the sense current level of the sense current 24 based on the heat being received by the thermal sense element 22. Thus, the thermal sense element 22 is positioned such that the thermal conduction from the RF amplification circuit 12 sets the sense current level of the sense current 24 as being indicative of the current magnitude of the RF signal current, which is provided by the amplified RF signal 16. In essence, by knowing the thermal response of the thermal sense element 22 to heat, and by knowing the relationship between the current magnitude and the resulting thermal conduction provided by the RF amplification circuit 12, one can know the current magnitude of the RF signal current as a result of the sense current level of the sense current 24.

The thermal sense element 22 sets the sense current level of the sense current 24 such that the thermal conduction provided from the RF amplification circuit 12 sets the sense current level of the sense current 24, and such that the sense current level reaches the trigger current level in response to the current magnitude of the RF signal current being above the current magnitude limit (procedure 1004). In one embodiment, the thermal sense element 22 is configured to set the sense current level of the sense current 24 such that the sense current level is substantially directly proportional to the temperature of the RF amplification circuit 12. In this case, parameters that may affect the sense current level other than the temperature of the RF amplification circuit 12 are provided so as to have little or no variation (at least relative to RF frequencies). In this manner, the thermal sense element 22 may be configured such that the sense current level is adjusted based solely on the thermal conduction from the RF amplification circuit 12.

Finally, the feedback circuit 20 decreases the current magnitude to or below the current magnitude limit in response to the sense current level of the sense current 24 reaching the trigger current level (procedure 1006). In the embodiment shown in FIG. 1, the current adjustment circuit 26 receives or simply monitors the sense current 24 from the thermal sense element 22 and responds to the sense current level of the sense current 24 reaching the trigger current level by decreasing the current magnitude of the RF current signal. In alternative embodiments, the thermal sense element 22 (rather than the current adjustment circuit 26) may be configured to be responsive to the sense current level of the sense current 24 reaching the trigger current level. In particular, the thermal sense element 22 may be configured to decrease the current magnitude as a result of the sense current level reaching the trigger current level. In these alternative embodiments, the current adjustment circuit 26 may or may not be provided.

Referring now to FIGS. 1 and 2, embodiments of the RF amplification device 10 and the method described in FIG. 2 may be employed in radio chip sets. The radio chip sets may manage power upstream from the RF amplification circuit 12. By employing the feedback circuit 20 to limit the current magnitude of the RF signal current, these radio chip sets eliminate the complexity of having to manage power in the RF amplification device 10. Rather, the RF signal current provided by the amplified RF signal 16 can be limited without adding expensive and complex circuitry within the RF amplification device 10.

In one embodiment, the RF amplification device 10 is utilized in the transmission chain of a front end of a user communication device. In one implementation of procedure 1000, the RF amplification circuit 12 amplifies the RF input signal 14 so as to generate the amplified RF signal 16 during a transmission burst of the RF input signal 14, such as a global system for mobile communications (GSM) transmission burst. The current adjustment circuit 26 may be configured to sample the sense current 24 during a time window of the transmission burst. For example, in one embodiment, the current adjustment circuit 26 is configured to begin sampling the sense current 24 within the first 20 microseconds of a transmission burst. It is assumed that prior to sampling, procedures 1002 and 1004 have already begun. In response to the sense current level of the sense current 24 reaching the trigger current level, the current adjustment circuit 26 decreases the current magnitude of the RF signal current by a discrete amount. At 100 microseconds, the current adjustment circuit 26 stops sampling the sense current 24 to end the time window. Note that the step size for decreasing the current magnitude may not bring the RF signal current to or below the current magnitude limit during the single transmission burst. Rather, it may take several transmission bursts resulting in the decrease of the current magnitude by the discrete step size to decrease the current magnitude to or below the current magnitude limit.

As explained in further detail below, in other embodiments, the sense current 24 is continuously monitored throughout the transmission burst and the current magnitude is continuously lowered to or below the current magnitude limit in response to the sense current level of the sense current 24 reaching the trigger current level. In this case, a reference current may be generated that sets the trigger current level. The sense current 24 and the reference current may be compared continuously by the current adjustment circuit 26 or some other circuitry in the feedback circuit 20. The feedback circuit 20 then decreases the current magnitude to or below the current magnitude limit as a result of the sense current 24 being compared to the reference current when the sense current 24 is above the trigger current level set by the reference current. In particular, the sense current 24 is compared to the reference current throughout the transmission burst. In this manner, the current magnitude of the RF signal current is decreased to or below the current magnitude limit each time the sense current level is above the trigger current level during the transmission burst.

Figure 3:
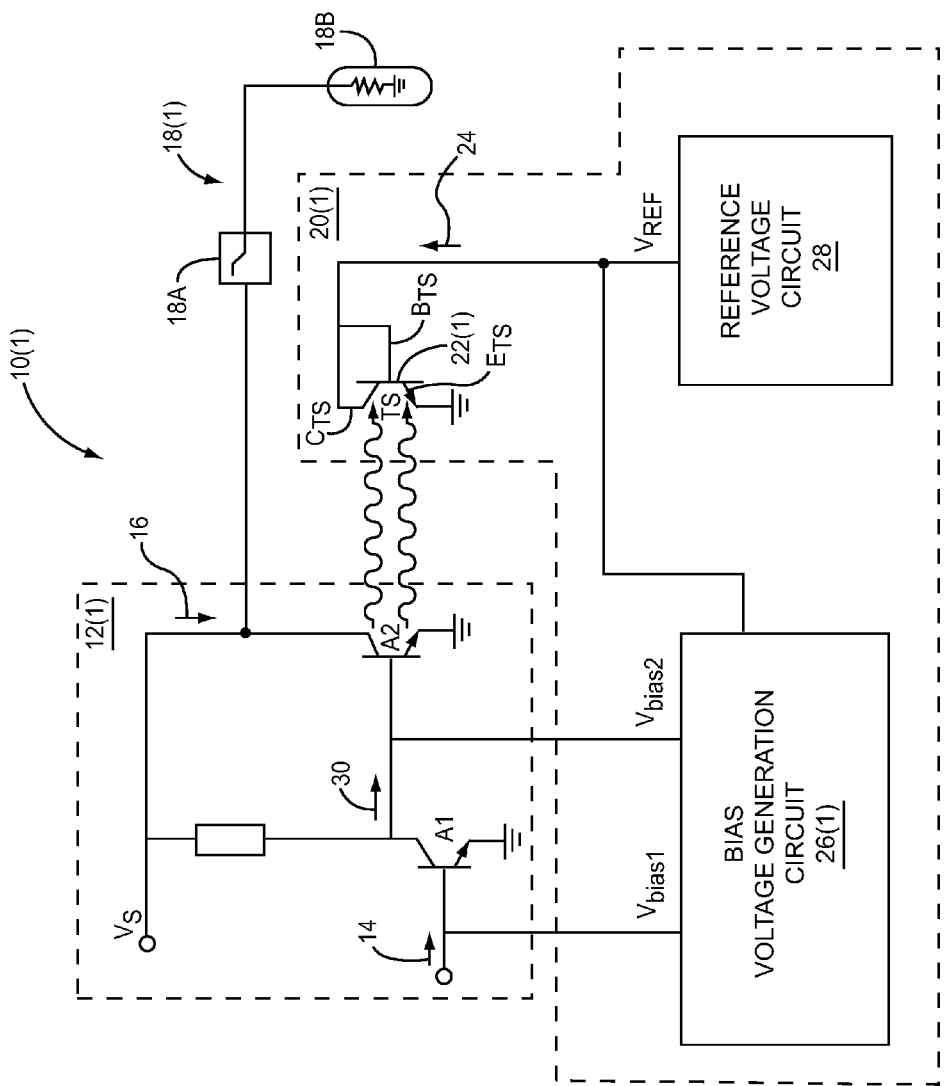
FIG. 3 illustrates a circuit diagram for one embodiment of the RF amplification device shown in FIG. 1.

Referring now to FIG. 3, FIG. 3 illustrates a circuit diagram of an RF amplification device 10(1). The RF amplification device 10(1) includes an RF amplification circuit 12(1) configured to receive the RF input signal 14 and generate the amplified RF signal 16. In this embodiment, the RF input signal 14 is an RF transmission signal that requires amplification for transmission by downstream RF circuitry 18(1).

The downstream RF circuitry 18(1) is coupled so as to receive the amplified RF signal 16 for transmission. For example, the downstream RF circuitry 18(1) of FIG. 3 includes an antenna tuner 18A and an antenna 18B.

As shown in FIG. 3, the RF amplification device 10(1) also has a feedback circuit 20(1). The feedback circuit 20(1) includes an embodiment of a thermal sense element 22(1) that is configured to generate the sense current 24. As shown in FIG. 3, the feedback circuit 20(1) is not electrically coupled to receive a feedback signal that is indicative of the current magnitude of the RF signal current from the RF amplification circuit 12(1). Rather, the thermal sense element 22(1) is positioned such that thermal conduction from the RF amplification circuit 12(1) sets the sense current level of the sense current 24 as being indicative of the current magnitude of the RF signal current, which is provided by the amplified RF signal 16.

In the embodiment shown in FIG. 3, the RF amplification circuit 12(1) includes two amplification stages. The first amplification stage is provided by a transistor A1 and the second amplification stage is provided by a transistor A2. The transistor A1 and the transistor A2 are cascoded with one another and the amplifier gain is approximately equal to a transistor gain of the transistor A1 multiplied by a transistor gain of the transistor A2. Each transistor A1, A2 receives a supply voltage $V_S$. The supply voltage $V_S$ may be generated by a power source, such as a battery. From the supply voltage $V_S$, the RF amplification circuit 12(1) generates the amplified RF signal 16. Since the transistor A2 is the final stage of the two amplification stages, the transistor A2 is of most concern regarding power consumption, because the transistor A2 handles the highest signal levels.

The thermal sense element 22(1) shown in FIG. 3 is provided by a transistor TS. The transistor TS is configured to generate the sense current 24 and is positioned such that thermal conduction from the transistor A2 in the RF amplification circuit 12(1) sets the sense current level of the sense current 24 as being indicative of the current magnitude of the RF signal current. In one embodiment, the RF amplification circuit 12(1) is formed on a semiconductor substrate. The thermal sense element 22(1) is also formed on the semiconductor substrate, so as to be positioned such that thermal conduction in the semiconductor substrate from the RF amplification circuit 12(1) sets the sense current level of the sense current 24. The semiconductor substrate may be any type of semiconductor substrate, such as a Silicon-based substrate, a Gallium Arsenide-based substrate, or an Indium Phosphide-based substrate.

In this embodiment, the transistor A2 in the RF amplification circuit 12(1) and the transistor TS of the feedback circuit 20(1) are formed on the same semiconductor substrate. The transistor TS is positioned on the semiconductor substrate such that the thermal conduction from the RF amplification circuit 12(1) sets the sense current level of the sense current 24 with the sense current level indicative of the current magnitude of the RF signal current. When more power is dissipated by the transistor A2, the temperature of the transistor A2 goes up, thereby increasing thermal conduction to the transistor TS in the feedback circuit 20(1). In response to the rise in temperature of the transistor A2, the transistor TS is heated, and thus raises the sense current level of the sense current 24. To avoid complexity, the sense current level of the sense current 24 should be based solely on the thermal conduction from the RF amplification circuit 12(1). Accordingly, any other parameters that could cause the sense current level of the sense current 24 to be adjusted should be held relatively constant, with little variation. Of course, the amount of variation permitted for these other parameters will depend on the application in which the RF amplification device 10(1) is being utilized, as well as the sensitivity of the components, such as the transistor TS.

In this embodiment, the feedback circuit 20(1) includes a reference voltage circuit 28. The reference voltage circuit 28 is configured to generate a reference voltage $V_{REF}$. The reference voltage circuit 28 may be any type of circuit that generates the reference voltage $V_{REF}$ so as to have a reference voltage level that is stable and relatively constant. As such, the reference voltage circuit 28 may be provided by a low dropout circuit, a bandgap circuit, and/or the like. The transistor TS is configured to generate the sense current 24 from the reference voltage $V_{REF}$. By using the reference voltage circuit 28 to power the generation of the sense current 24, variations in the sense current 24 due to supply changes are minimized. In this manner, a particular sense current level may correspond to a particular current magnitude of the RF signal current, or at least have a correspondence with the particular current magnitude within an acceptable statistical error range. Since the reference voltage level of the reference voltage $V_{REF}$ can be assumed (at least within an acceptable statistical error range) to be constant, the sense current level of the sense current 24 only varies based on the thermal conduction from the RF amplification circuit 12(1).

As mentioned above, the thermal sense element 22(1) is provided as the transistor TS shown in FIG. 3. The transistor TS is a bipolar junction transistor. As such, the transistor TS has a base $B_{TS}$, a collector $C_{TS}$, and an emitter $E_{TS}$. The collector $C_{TS}$ is coupled to the reference voltage circuit 28 such that the transistor TS generates the sense current 24 from the reference voltage $V_{REF}$ as a collector current. To further limit any variations in the sense current level of the sense current 24 not associated with the thermal conduction from the RF amplification circuit 12(1), the collector $C_{TS}$ and the base $B_{TS}$ are coupled such that the transistor TS operates in a diode mode. The emitter $E_{TS}$ is coupled to ground. As such, the transistor TS behaves like a diode. The voltage input into the diode is relatively constant because the reference voltage level of the reference voltage $V_{REF}$ is relatively steady and the emitter $E_{TS}$ is coupled to ground.

The RF amplification circuit 12(1) is heated in accordance with the current magnitude of the RF signal current provided by the amplified RF signal 16. Accordingly, the thermal conduction from the RF amplification circuit 12(1) to the transistor TS varies based on the current magnitude of the RF signal current provided by the amplified RF signal 16. As such, a temperature of the transistor TS in the feedback circuit 20(1) depends on the thermal conduction from the RF amplification circuit 12(1). Since the transistor TS is driven by the reference voltage $V_{REF}$ from the reference voltage circuit 28, the sense current level of the sense current 24 generated by the transistor TS depends only on the thermal conduction from the RF amplification circuit 12(1). Accordingly, the sense current level of the sense current 24 can be presumed to be a function of only the temperature of the RF amplification circuit 12(1), in this particular embodiment, the temperature of the transistor A2. Therefore, when the current magnitude of the RF signal current is above the current magnitude limit, the amount of thermal conduction from the transistor A2 causes the sense current level of the sense current 24 to reach the trigger current level. For example, if the RMS current magnitude of the RF signal current provided by the amplified RF signal 16 is above an RMS current magnitude limit, the amount of thermal conduction from the transistor A2 causes the sense current level of the sense current 24 to reach the trigger current level.

The current adjustment circuit 26 shown in FIG. 1 is provided in the feedback circuit 20(1) of FIG. 3 as a bias voltage generation circuit 26(1). The bias voltage generation circuit 26(1) is configured to generate a first bias voltage $V_{bias1}$ having a first bias voltage level and a second bias voltage $V_{bias2}$ having a second bias voltage level. The first bias voltage $V_{bias1}$ and the second bias voltage $V_{bias2}$ are provided to the RF amplification circuit 12(1). In this manner, a quiescent operating voltage level of the amplified RF signal 16 is set in accordance with the bias voltage level of the first bias voltage $V_{bias1}$ and the bias voltage level of the second bias voltage $V_{bias2}$. The quiescent operating voltage level of the amplified RF signal 16 may be defined as the voltage level of the amplified RF signal 16 that results from the RF input signal 14 having a voltage level of zero (0).

In this embodiment, the first bias voltage $V_{bias1}$ is applied to the RF input signal 14 to place the RF input signal 14 within an operating range of the transistor A1. In response, the transistor A1 generates an intermediary RF input signal 30. The second bias voltage $V_{bias2}$ is applied to the intermediary RF input signal 30 to place the intermediary RF input signal 30 within the operating range of the transistor A2. The transistor A2 then amplifies the intermediary RF input signal 30 to generate the amplified RF signal 16. The amplifier gain of the RF amplification circuit 12(1) shown in FIG. 3 is thus approximately the gain of the transistor A1 multiplied by the gain of the transistor A2.

The quiescent operating voltage level is adjustable by adjusting the first bias voltage level of the first bias voltage $V_{bias1}$ and/or by adjusting the second bias voltage level of the second bias voltage $V_{bias2}$. The bias voltage generation circuit 26(1) is coupled to monitor the sense current 24 during a time window of a transmission burst. The bias voltage generation circuit 26(1) is operable to provide the first bias voltage level and the second bias voltage level so as to maintain the quiescent operating voltage level of the amplified RF signal 16 essentially constant. As the current magnitude of the amplified RF signal 16 increases, so does the heat generated by the transistor A2.

If the current magnitude of the amplified RF signal 16 rises above the current magnitude limit, the transistor TS is configured so that the sense current level of the sense current 24 reaches the trigger current level in response to the current magnitude being above the current magnitude limit. In response to the sense current level of the sense current 24 reaching the trigger current level, the bias voltage generation circuit 26(1) lowers the quiescent operating voltage level of the amplified RF signal 16. The bias voltage generation circuit 26(1) may lower the quiescent operating voltage level by decreasing the first bias voltage level of the first bias voltage $V_{bias1}$ and/or by decreasing the second bias voltage level of the second bias voltage $V_{bias2}$ in response to the sense current level of the sense current 24 reaching the trigger current level. In one embodiment, the bias voltage generation circuit 26(1) is configured to lower the quiescent operating voltage level by a discrete amount during the time window. The discrete amount may or may not be sufficient to decrease the current magnitude to or below the current magnitude limit in the time window of one transmission burst. Accordingly, it may take several transmission bursts where the first bias voltage level and/or the second bias voltage level of the bias voltages $V_{bias1}, V_{bias2}$ are decreased by the discrete amount in order to decrease the current magnitude of the RF signal current to or below the current magnitude limit.

Figure 4:
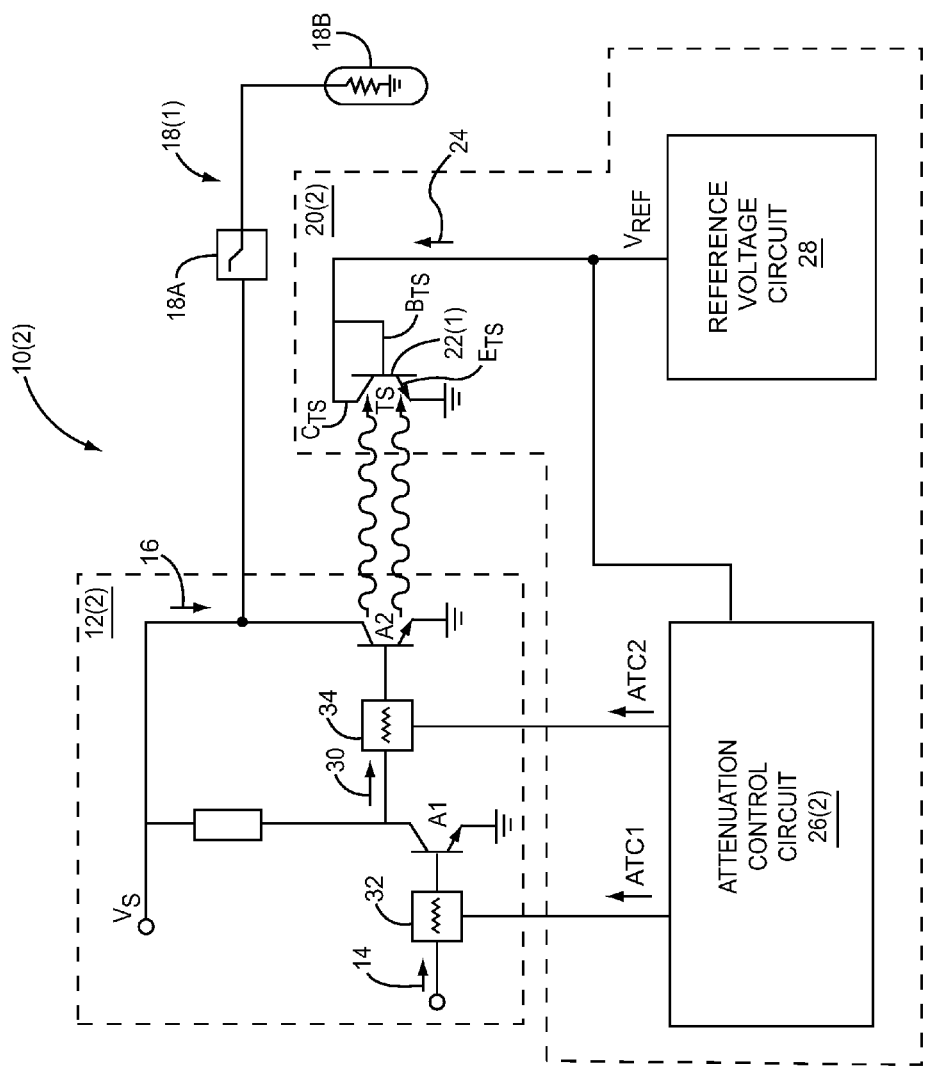
FIG. 4 illustrates a circuit diagram for another embodiment of the RF amplification device shown in FIG. 1.

FIG. 4 is a circuit diagram illustrating another embodiment of an RF amplification device 10(2). An RF amplification circuit 12(2) of the RF amplification device 10(2) operates in a manner similar to the RF amplification device 10(1) shown in FIG. 3. However, in this embodiment, the RF amplification circuit 12(2) includes a first attenuator 32 and a second attenuator 34. The first attenuator 32 has a first attenuation level and is coupled to the transistor A1 so that the RF input signal 14 is attenuated in accordance with the first attenuation level prior to being amplified by the transistor A1. The second attenuator 34 has a second attenuation level. The second attenuator 34 attenuates the intermediary RF input signal 30 in accordance with the second attenuation level prior to amplification by the transistor A2. Accordingly, the current magnitude of the RF amplification current provided by the amplified RF signal 16 can be adjusted by adjusting the first attenuation level and/or the second attenuation level.

In this embodiment, both the first attenuation level of the first attenuator 32 and the second attenuation level of the second attenuator 34 can be varied. In this particular embodiment, the first attenuator 32 is configured to adjust the first attenuation level in accordance with a first attenuation control signal level of a first attenuation control signal ATC1. The second attenuator 34 is configured to adjust the second attenuation level in accordance with a second attenuation control signal level of a second attenuation control signal ATC2.

Like the feedback circuit 20(1) shown in FIG. 3, a feedback circuit 20(2) shown in FIG. 4 has the thermal sense element 22(1) and the reference voltage circuit 28. Both the thermal sense element 22(1) and the reference voltage circuit 28 shown in FIG. 4 operate in the same manner described above with regard to FIG. 3. However, in this embodiment, the feedback circuit 20(2) includes an attenuation control circuit 26(2) as the current adjustment circuit 26 (shown in FIG. 1). The attenuation control circuit 26(2) is configured to generate the first attenuation control signal ATC1 having the first attenuation control signal level and the second attenuation control signal ATC2 having the second attenuation control signal level. The first attenuation control signal level of the first attenuation control signal ATC1 and the second attenuation control signal level of the second attenuation control signal ATC2 set the first attenuation level and the second attenuation level, respectively.

During a time window of a transmission burst, the attenuation control circuit 26(2) is configured to monitor the sense current level of the sense current 24. If the sense current level is below the trigger current level, the attenuation control circuit 26(2) maintains the first attenuation control signal level of the first attenuation control signal ATC1 and the second attenuation control signal level of the second attenuation control signal ATC2 relatively constant. However, in response to the sense current level of the sense current 24 reaching the trigger current level, the attenuation control circuit 26(2) adjusts the first attenuation control signal level of the first attenuation control signal ATC1 and/or the second attenuation control signal level of the second attenuation control signal ATC2 so as to increase the first attenuation level of the first attenuator 32 and/or the second attenuation level of the second attenuator 34. As a result, the current magnitude of the RF signal current provided by the amplified RF signal 16 is decreased.

In one embodiment, the attenuation control circuit 26(2) decreases the current magnitude of the RF signal current by a discrete amount. This discrete amount may or may not be sufficient to decrease the current magnitude to or below the current magnitude limit during a single transmission burst. Thus, it may take several transmission bursts to decrease the current magnitude of the RF signal current to or below the current magnitude limit.

Figure 5:
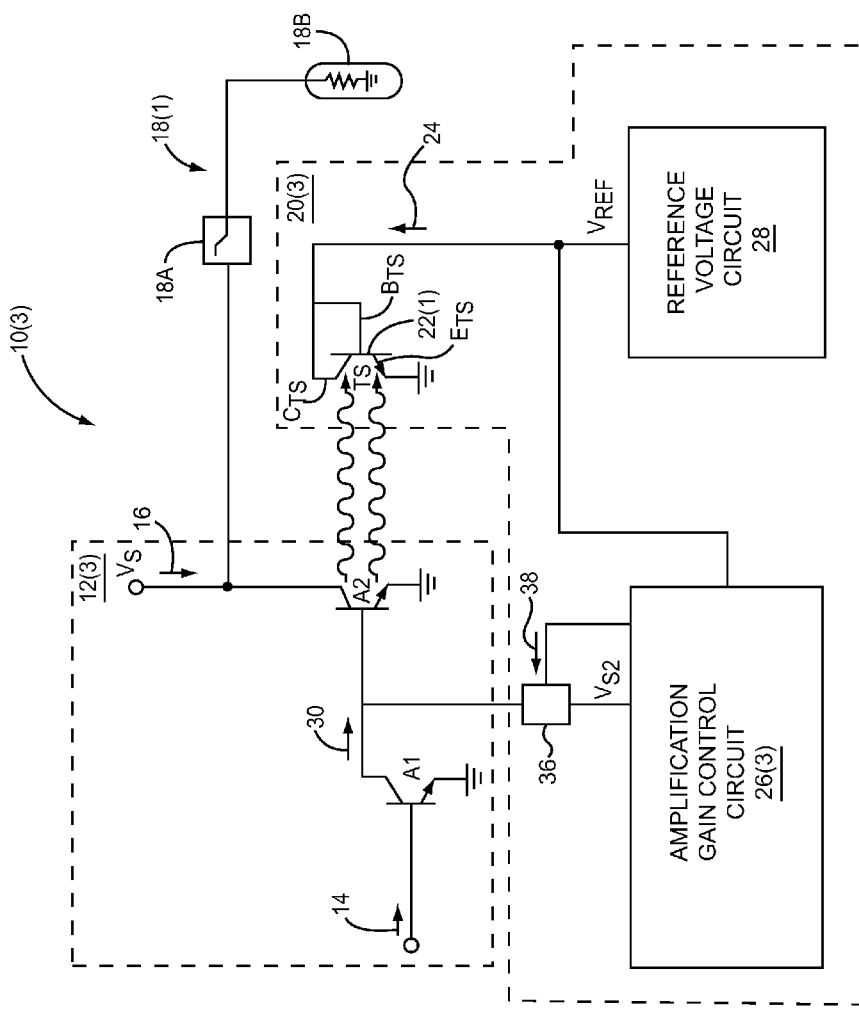
FIG. 5 illustrates a circuit diagram for yet another embodiment of the RF amplification device shown in FIG. 1.

FIG. 5 is a circuit diagram of yet another embodiment of an RF amplification device 10(3). The RF amplification device 10(3) includes an RF amplification circuit 12(3) configured to amplify the RF input signal 14. Like the RF amplification circuit 12(1) shown in FIG. 3, the RF amplification circuit 12(3) shown in FIG. 5 has the transistor A1 and the transistor A2 cascoded with one another so that each provides amplification to the RF input signal 14. However, in this embodiment, while the transistor A2 is powered by the supply voltage $V_S$, the transistor A1 is powered by a second supply voltage $V_{S2}$ in a feedback circuit 20(3). This second supply voltage $V_{S2}$ is provided to the transistor A1 through a variable impedance element 36. The gain of the transistor A1 is set in accordance with the impedance level of the variable impedance element 36. Accordingly, by adjusting the impedance level of the variable impedance element 36, the gain of the transistor A1 and the gain of the RF amplification circuit 12(3) are adjusted.

The feedback circuit 20(3) is configured to adjust the amplifier gain of the RF amplification circuit 12(3) in response to the sense current level of the sense current 24 reaching the trigger current level. The feedback circuit 20(3) shown in FIG. 5 also includes the thermal sense element 22(1) and the reference voltage circuit 28 described above. To adjust the amplifier gain of the RF amplification circuit 12(3), the feedback circuit 20(3) shown in FIG. 5 has an amplifier gain control circuit 26(3). The feedback circuit 20(3) generates the second supply voltage $V_{S2}$ and an impedance control signal 38 having an impedance control signal level. During a time window of a transmission burst, the amplifier gain control circuit 26(3) is configured to monitor the sense current level of the sense current 24. While the sense current level is below the trigger current level, the amplifier gain control circuit 26(3) maintains the control signal level of the impedance control signal 38 relatively steady, and the gain of the transistor A1 does not change significantly. However, in response to the sense current level of the sense current 24 reaching the trigger current level, the amplifier gain control circuit 26(3) is configured to adjust the impedance control signal level of the impedance control signal 38 and thereby adjust the impedance level of the variable impedance element 36.

As a result, the feedback circuit 20(3) adjusts the amplifier gain of the RF amplification circuit 12(3) in response to the sense current level of the sense current 24 reaching the trigger current level. In one embodiment, the amplifier gain control circuit 26(3) adjusts the amplifier gain by a discrete amount in response to the sense current level of the sense current 24 reaching the trigger current level. The discrete amount may or may not be sufficient to decrease the current magnitude of the RF signal current below the current magnitude limit during the time window of a single transmission burst. As such, it may take several transmission bursts, each lowering the amplifier gain by the discrete amount, to decrease the current magnitude of the RF signal current below the current magnitude limit.

It should be noted that while the amplifier gain control circuit 26(3) shown in FIG. 5 adjusts the gain of the transistor A1, other embodiments of the amplifier gain control circuit 26(3) may be configured to adjust the gain of the transistor A2. Also, in other embodiments, the feedback circuit 20(3) may be implemented so as to adjust the amplifier gain in any other manner.

Figure 6:
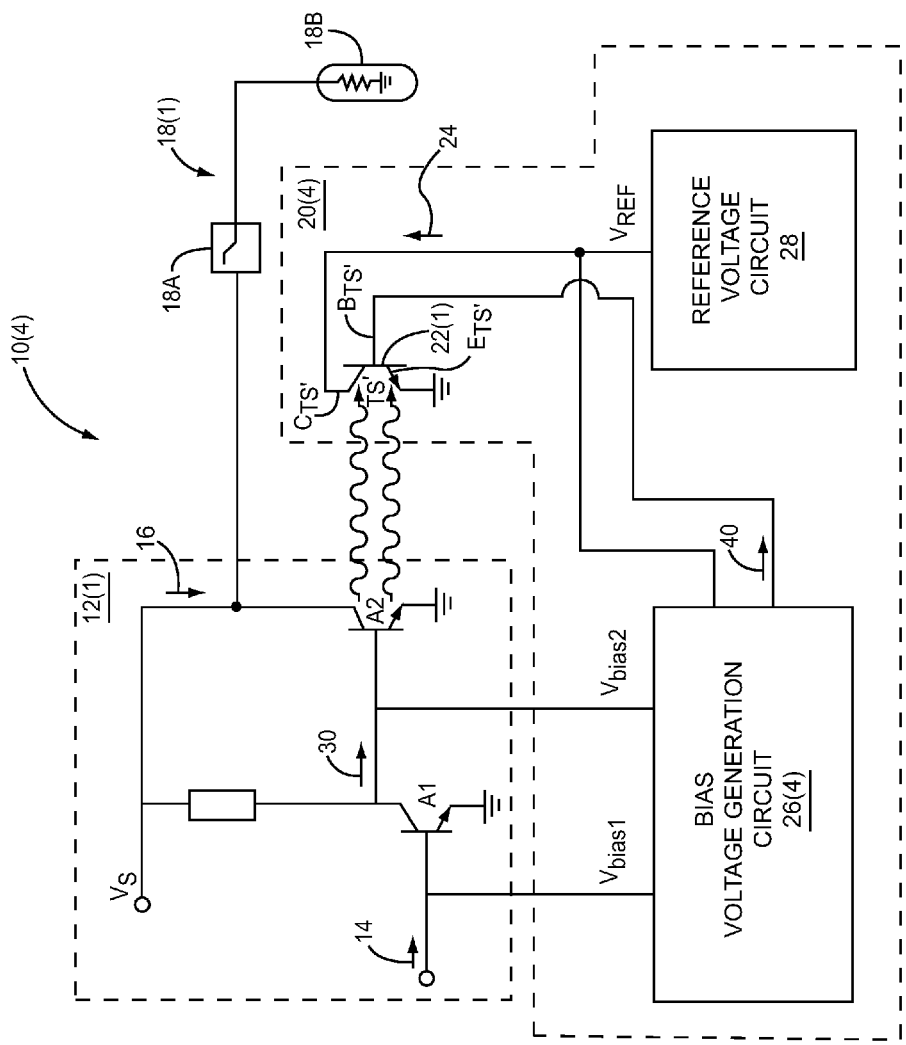
FIG. 6 illustrates a circuit diagram for still another embodiment of the RF amplification device shown in FIG. 1.

FIG. 6 illustrates a circuit diagram of still another embodiment of an RF amplification device 10(4). The RF amplification device 10(4) shown in FIG. 6 has the same RF amplification circuit 12(1) described above with regard to FIG. 3. A feedback circuit 20(4) provided by the RF amplification device 10(4) also includes the reference voltage circuit 28 described above. However, the feedback circuit 20(4) includes another embodiment of a thermal sense element 22(2).

In this case, the thermal sense element 22(2) is provided by a transistor TS'. The transistor TS' has a collector $C_{TS'}$, a base $B_{TS'}$, and an emitter $E_{TS'}$. The collector $C_{TS'}$ is coupled to the reference voltage circuit 28 such that the transistor TS' generates the sense current 24 from the reference voltage $V_{REF}$ as a collector current. The emitter ETS' is coupled to ground. In this embodiment, the base BTS' of the transistor TS' is coupled to receive a control signal 40. The control signal 40 has a control signal level, and thus the sense current level of the sense current 24 is set in accordance with the thermal conduction from the RF amplification circuit 12(1) and the control signal level of the control signal 40.

The feedback circuit 20(4) is configured to generate the control signal 40. The feedback circuit 20(4) includes a bias voltage generation circuit 26(4) which is configured to generate the control signal 40. The bias voltage generation circuit 26(4) is configured to monitor the sense current level of the sense current 24 and generate the first bias voltage $V_{bias1}$ and the second bias voltage $V_{bias2}$ in the same manner described above with regard to the bias voltage generation circuit 26(1) shown in FIG. 3. However, this embodiment of the bias voltage generation circuit 26(4) is also configured to generate the control signal 40 having the control signal voltage level.

Since the reference voltage level of the reference voltage $V_{REF}$ generated by the reference voltage circuit 28 can be assumed to be constant and unvariable, the control voltage level of the control signal 40 sets a correspondence between the current magnitude of the RF signal current provided by the amplified RF signal 16 and the sense current level of the sense current 24. For instance, if the control signal 40 is provided at a particular control signal level, the sense current level of the sense current 24 reaches the trigger current level in response to the current magnitude of the RF signal current being provided at or above a particular current magnitude. This is because the current magnitude of the RF signal current provided by the amplified RF signal 16 causes the RF amplification circuit 12(1) to generate a particular amount of heat and thereby provide a particular amount of thermal conduction to the thermal sense element 22(2). However, if the control signal level of the control signal 40 is raised, the sense current level of the sense current 24 reaches the trigger current level in response to the RF signal current operating at a lower current magnitude. In effect, the current magnitude limit of the current magnitude is lowered. This is because less thermal conduction has to be provided from the RF amplification circuit 12(1) in order for the sense current level of the sense current 24 to reach the trigger current level. As a result, if the control signal level of the control signal 40 is raised, the sense current levels of the sense current 24 correspond to lower current magnitudes since less thermal conduction is needed in order for the sense current 24 to have a particular sense current level.

In contrast, if the control signal level of the control signal 40 is lowered, more thermal conduction from the RF amplification circuit 12(1) is needed to provide the sense current 24 at a particular sense current level. As such, the sense current level of the sense current 24 will correspond to higher current magnitudes of the RF signal current provided by the amplified RF signal 16. The current magnitude limit of the current magnitude is thus effectively raised.

Figure 7:
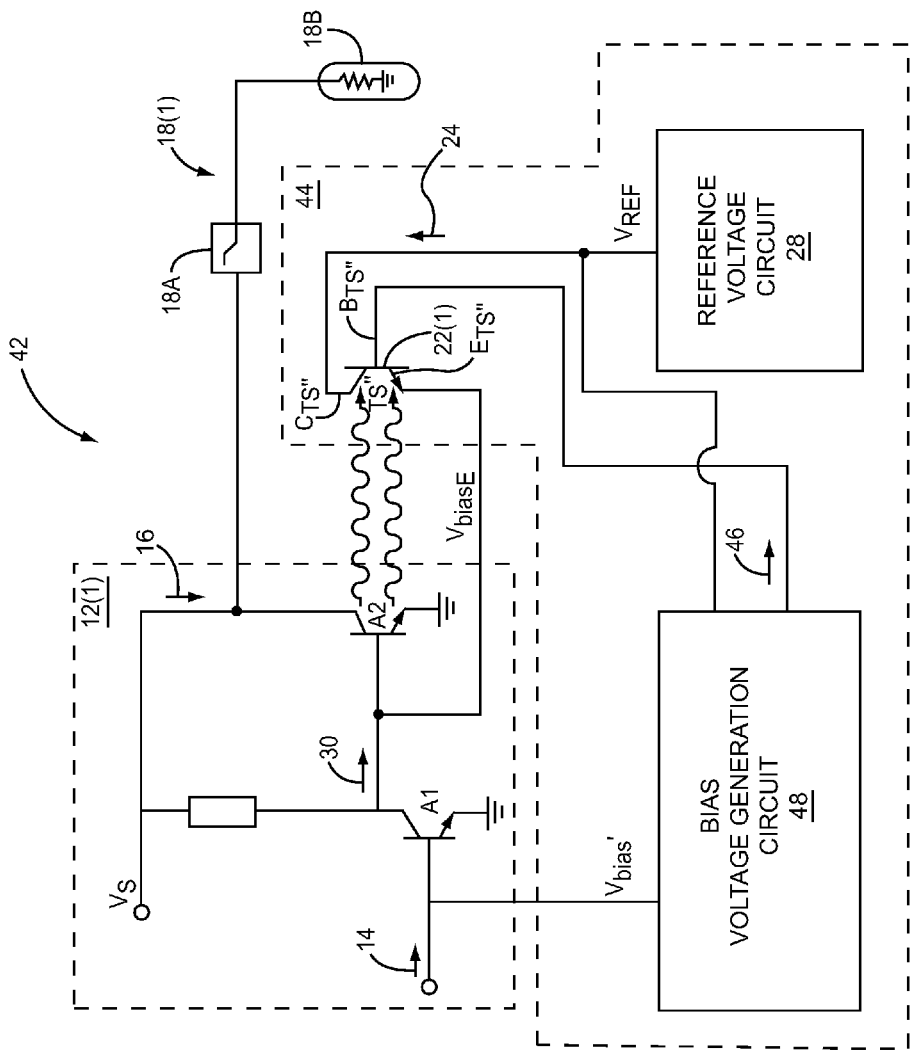
FIG. 7 illustrates a circuit diagram of another embodiment of an RF amplification device, which is not an embodiment of the RF amplification device shown in FIG. 1.

FIG. 7 is a circuit diagram of still another embodiment of an RF amplification device 42. However, unlike the RF amplification device 10 shown in FIG. 1 and the RF amplification devices 10(1), 10(2), 10(3) described in FIGS. 3-6, the RF amplification device 42 has a feedback circuit 44 which does not include the current adjustment circuit 26 (shown in FIG. 1) that adjusts the current magnitude of the RF signal current provided by the amplified RF signal 16. Rather, a thermal sense element 22(3) is provided so that the feedback circuit 44 is operable to decrease the current magnitude to or below the current magnitude limit. The thermal sense element 22(3) is configured to decrease the current magnitude to or below the current magnitude limit in response to the sense current level of the sense current 24 reaching the trigger current level.

In the particular embodiment of the feedback circuit 44 shown in FIG. 7, the thermal sense element 22(3) is provided by a transistor TS". The transistor TS" has a collector $C_{TS''}$, a base $B_{TS''}$, and an emitter $E_{TE''}$. Within the feedback circuit 44, the reference voltage circuit 28 described above and configured to generate the reference voltage $V_{REF}$ is coupled to the collector $C_{TS''}$. Accordingly, the collector $C_{TE''}$ is coupled to the reference voltage circuit 28 such that the transistor TS" generates the sense current 24 from the reference voltage $V_{REF}$ as a collector current.

The feedback circuit 44 is configured to generate a bias control signal 46 having a bias control signal level. More particularly, the feedback circuit 44 shown in FIG. 7 has a bias voltage generation circuit 48 that generates the bias control signal 46. The base $B_{TS''}$ of the transistor TS" is coupled to receive the bias control signal 46 from the bias voltage generation circuit 48. The emitter $E_{TE''}$ of the transistor TS" generates the bias voltage $V_{biasE}$ such that the bias voltage $V_{biasE}$ is the emitter voltage of the transistor TS". In this particular embodiment, the bias voltage $V_{biasE}$ is applied to the intermediary RF input signal 30 to set the quiescent operating voltage level of the RF signal current provided by the amplified RF signal 16. The bias voltage generation circuit 48 also generates a bias voltage $V_{bias'}$ that is applied to the RF input signal 14. The bias voltage level of the bias voltage $V_{bias'}$ also determines the quiescent operating voltage level of the amplified RF signal 16. However, in this embodiment, the bias voltage generation circuit 48 is configured to decrease the bias voltage level of the bias voltage $V_{biasE}$ in response to the sense current level of the sense current 24 reaching the trigger current level. To do this, the bias voltage generation circuit 48 monitors the sense current level of the sense current 24.

Coupling the emitter $E_{TS''}$ to provide the bias voltage $V_{biasE}$ to the RF amplification circuit 12(1), a negative feedback loop is formed such that the bias voltage level is constant (as long as a voltage difference between the base $B_{TS''}$ and the emitter $E_{TS''}$ is above the turn-on voltage) while the sense current level is below the trigger current level. In essence, the bias voltage generation circuit 48 provides the bias control signal level of the bias control signal 46 at a particular value prior to the sense current level reaching the trigger current level. As such, the bias voltage level of the bias voltage $V_{biasE}$ is set in accordance with this bias control signal level. Once the sense current level of the sense current 24 reaches the trigger current level, the bias voltage generation circuit 48 lowers the bias control signal level of the bias control signal 46, and thereby lowers the bias voltage level of the bias voltage $V_{biasE}$. This lowers the quiescent operating voltage level in order to decrease the current magnitude of the RF signal current to or below the current magnitude limit. Accordingly, the bias voltage level of the bias voltage $V_{biasE}$ is decreased in response to the sense current level of the sense current 24 reaching the trigger current level, so as to lower the quiescent operating voltage level and decrease the current magnitude of the RF signal current to or below the current magnitude limit.

Figure 8:
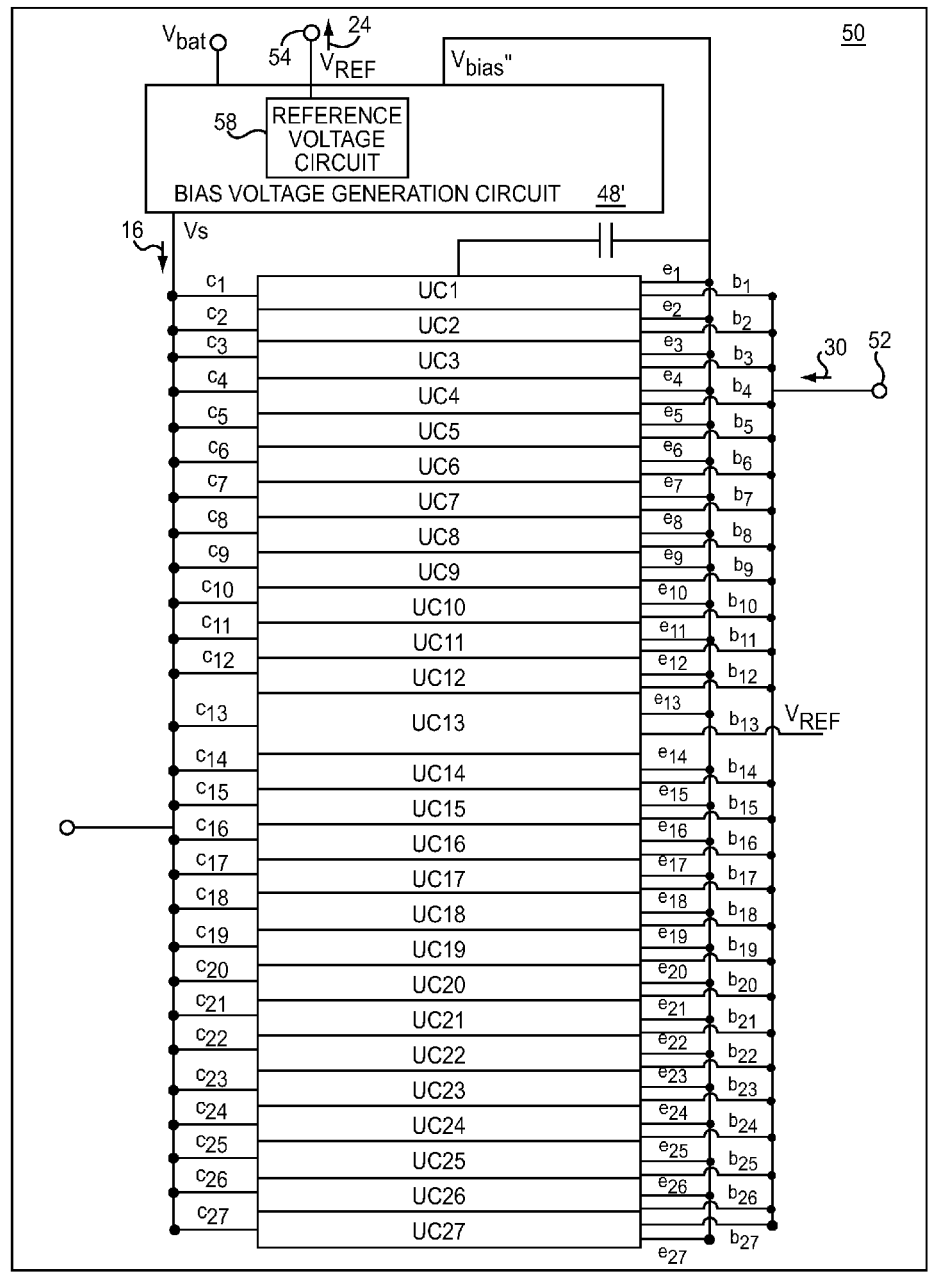
FIG. 8 illustrates an embodiment of an RF amplification device formed on a semiconductor substrate.

FIG. 8 illustrates one embodiment of a final stage of an RF amplification circuit, a thermal sense element, and a bias voltage generation circuit 48' formed on a semiconductor substrate 50. The semiconductor substrate 50 may be any type of semiconductor substrate, such as a Silicon-based substrate, a Gallium Arsenide-based substrate, an Indium Phosphide-based substrate, and/or the like. The semiconductor substrate 50 may have various different layers, such as a wafer layer and a device layer. The final stage, the thermal sense element, and the bias voltage generation circuit 48' shown in FIG. 8 are formed in the device layer of the semiconductor substrate 50. Other layers may be provided between the wafer layer and the device layer depending on the particular type of semiconductor technology being employed. Furthermore, the layers of the semiconductor substrate 50 may include various sub-layers depending on the semiconductor technology being employed. For example, the device layer may include various sub-layers of doped semiconductor material, metallic layers, insulating layers, and/or the like.

As shown in FIG. 8, the semiconductor substrate 50 includes a plurality of unit cells (referred to generically as elements UC, and specifically as elements UC1-UC27). In this embodiment, each unit cell UC forms a single transistor. Each transistor includes a collector (referred to generically as element c, and specifically as elements $c_1$-$c_{27}$), a base (referred to generically as element b, and specifically as $b_1$-$b_{27}$) and an emitter (referred to generically as element e, and specifically as elements $e_1$-$e_{27}$). The final stage of the RF amplification circuit is provided by the transistors in unit cells UC1-UC12 and UC14-UC27.

To make up the final stage of the RF amplification circuit, the transistors provided by the unit cells UC1-UC12 and UC14-UC27 are coupled in parallel. Accordingly, the intermediary RF input signal 30 is received from a previous amplification stage at a terminal 52 and the intermediary RF input signal 30 is split up so that each of the bases $b_{12}$-$b_{12}$ and $b_{14}$-$b_{27}$ receives a portion of the intermediary RF input signal 30. The collectors $c_1$-$c_{12}$ and the collectors $c_{14}$-$c_{27}$ are coupled to one another such that each transistor provided by the unit cells UC1-UC12 and UC14-UC27 provides amplification so as to generate the amplified RF signal 16. Therefore, the amplified RF signal 16 provides the RF signal current as a combination of the collector currents from the collectors $c_1$-$c_{12}$ and the collectors $c_{14}$-$c_{27}$.

The thermal sense element is provided by the transistor in unit cell UC13. In this embodiment, the thermal sense element is thus the transistor at the center of the array of transistors. The thermal sense element does not amplify the intermediary RF input signal 30. Therefore, the collector $c_{13}$ is uncoupled from the collectors $c_1$-$c_{12}$ and $c_{14}$-$c_{27}$ and the base b13 is also uncoupled from the bases $b_{12}$-$b_{12}$ and $b_{14}$-$b_{27}$. Rather, the collector $c_{13}$ and the base $b_{13}$ of the thermal sense element are coupled to each other so that the transistor provided by the unit cell UC13 operates in a diode mode.

In this embodiment, the bias voltage generation circuit 48' includes the reference voltage circuit 28 that generates the reference voltage $V_{REF}$. The collector $c_{13}$ and the base $b_{13}$ of the transistor provided by the unit cell UC13 is coupled to a terminal 54 so that the sense current 24 is generated as a collector current of the transistor provided in the unit cell UC13. Similar to the embodiment of the RF amplification device 42 shown in FIG. 7, the emitter $e_{13}$ is coupled to the emitters $e_1$-$e_{12}$ and $e_{14}$-$e_{27}$ so that an emitter voltage from the unit cell UC13 sets the quiescent operating voltage level of the amplified RF signal 16.

The bias voltage generation circuit 48' monitors the sense current level of the sense current 24. Similar to the embodiment of the RF amplification device 42 shown in FIG. 7, the bias voltage generation circuit 48' also generates a bias voltage $V_{bias''}$ having a bias voltage level. However, in this example, the bias voltage $V_{bias''}$ is not provided to previous amplification stages. Rather, the bias voltage $V_{bias''}$ is applied to the emitters e of the unit cells UC. In response to the sense current level of the sense current 24 reaching the trigger current level, the bias voltage generation circuit 48' adjusts the bias voltage level of the bias voltage $V_{bias''}$ to lower the quiescent operating voltage level of the amplified RF signal 16. As a result, the current magnitude of the RF signal current provided by the amplified RF signal 16 is decreased to or below the current magnitude limit.

By being positioned in the array of transistors, the transistor provided by the unit cell UC13 is positioned such that thermal conduction from the RF amplification circuit (in this case, from the final stage of the RF amplification circuit, which includes the transistors of unit cells UC1-UC12 and UC14-UC27) sets the sense current level of the sense current 24 as being indicative of the current magnitude of the RF signal current provided by the amplified RF signal 16. While the transistor provided by the unit cell UC13 is not coupled to provide amplification to the intermediary RF input signal 30, the transistor in unit cell UC13 is part of the feedback circuit and receives feedback as the thermal conduction from the unit cells UC1-UC12 and UC14-UC27. Note that in this embodiment, the bias voltage generation circuit 48' generates a supply voltage Vs from a battery voltage $V_{bat}$. The supply voltage Vs is provided to the collectors $c_1$-$c_{12}$ and $c_{14}$-$c_{27}$ to provide the power needed to amplify the intermediary RF input signal 30.

Figure 9:
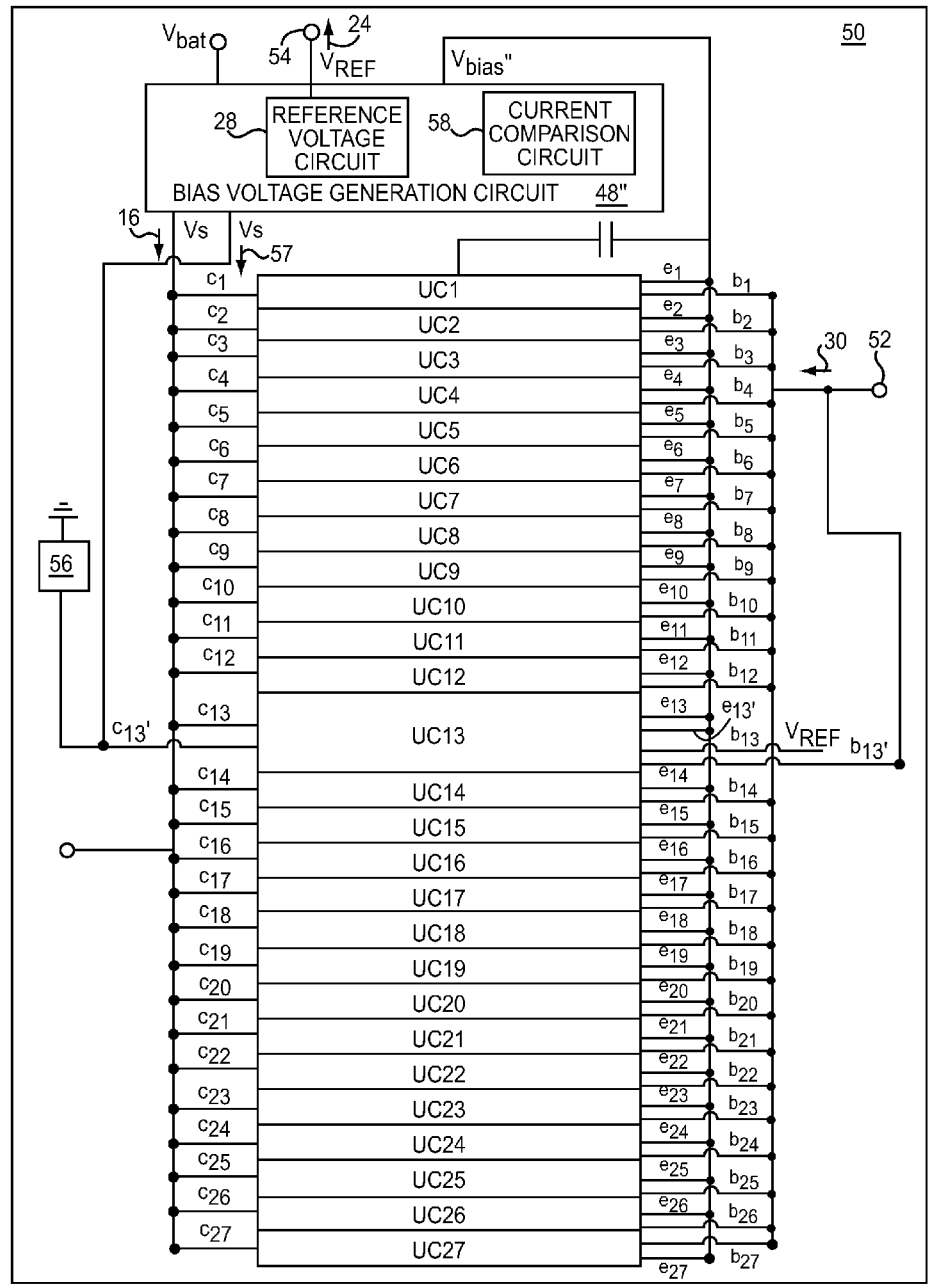
FIG. 9 illustrates another embodiment of an RF amplification device formed on the semiconductor substrate.

FIG. 9 illustrates another embodiment of an array of transistors and a bias voltage generation circuit 48". The array of transistors shown in FIG. 9 is similar to the array of transistors shown in FIG. 8. However, the unit cell UC13 includes another transistor having a collector $c_{13'}$, a base $b_{13'}$, and an emitter $e_{13'}$. The sense current 24 in this embodiment is still provided by the collector $c_{13}$. Like the collector $c_{13}$, the collector $c_{13'}$, of the other transistor in the unit cell UC13 is also uncoupled from the collectors $c_1$-$c_{12}$ and $c_{14}$-$c_{27}$. However, the collector $c_{13'}$ also receives the supply voltage Vs from the bias voltage generation circuit 48" and the base $b_{13'}$, is also coupled to receive a portion of the intermediary RF input signal 30. The base $b_{13'}$, is coupled to the terminal 52. The collector $c_{13'}$, of the other transistor provided by the unit cell UC13 is coupled to a load 56. The load 56 is uncoupled from the transistors provided by the unit cells UC1-UC12 and UC14-UC27. Accordingly, the load 56 is not coupled to the collectors $c_1$-$c_{12}$ and $c_{14}$-$c_{27}$. Unlike the downstream RF circuitry 18 (shown in FIG. 1), the load 56 has a constant impedance that never varies or that has an insignificant amount of variance. As such, the collector $c_{13}$ generates a comparison current 57 as a collector current. The comparison current 57 operates at the trigger current level. As such, the trigger current level oscillates with the comparison current 57.

In this embodiment, the bias voltage generation circuit 48" includes a current comparison circuit 58. The current comparison circuit 58 is configured to compare the sense current 24 and the comparison current 57 and decrease the current magnitude of the RF signal current provided by the amplified RF signal 16 to or below the current magnitude limit in response to the sense current level of the sense current 24 reaching the trigger current level of the comparison current 57. In this manner, rather than decreasing the current magnitude of the RF signal current during a time window of a transmission burst, the sense current 24 is compared to the comparison current 57 throughout the transmission burst. As such, the current magnitude of the RF signal current provided by the amplified RF signal 16 can be decreased throughout the entire transmission burst. Also, the decrease in the current magnitude when the current magnitude is above the current magnitude limit occurs more quickly and overshoot is detected faster.

However, the embodiment shown in FIG. 9 is more complex than the embodiment shown in FIG. 8. The transistors in the unit cell UC13 should be configured carefully so that the current magnitude is limited appropriately. For instance, in one embodiment, the transistors in the unit cells UC1-UC12 and UC14-UC27 all have the same size. Also, the transistor in the unit cell UC13 that generates the comparison current 57 is configured to have approximately the same size as the transistors in the unit cells UC1-UC12 and UC14-UC27. The transistor that provides and generates the sense current 24 in the unit cell UC13 is sized differently and may be significantly smaller than the other transistor in the unit cell UC13. For example, the transistor that provides and generates the sense current 24 in the unit cell UC13 may be 1/x the size of the other transistor in the unit cell UC13. The parameter x is an integer that equals the number of transistors in the array of transistors that provide amplification. Accordingly, for the embodiment shown in FIG. 9, the parameter x is equal to the integer twenty-six (26). The sense current level reaches the trigger current level in response to the RF signal current provided by the amplified RF signal 16 being above the current magnitude limit, when the sense current level of the sense current 24 is equal to or greater than 1/x * a current level of the comparison current 57.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) amplification device, comprising:
   an RF amplification circuit configured to amplify an RF input signal so as to generate an amplified RF signal that provides an RF signal current with a current magnitude, wherein the RF amplification circuit is heated in accordance with the current magnitude of the RF signal current; and
   a feedback circuit comprising a thermal sense element, wherein:
      the thermal sense element is configured to generate a sense current having a sense current level;
      the thermal sense element is positioned such that thermal conduction from the RF amplification circuit sets the sense current level of the sense current as being indicative of the current magnitude of the RF signal current, and such that the sense current level reaches a trigger current level of the feedback circuit in response to the current magnitude of the RF signal current being above a current magnitude limit; and
      the feedback circuit is operable to decrease the current magnitude to or below the current magnitude limit in response to the sense current level of the sense current reaching the trigger current level.

2. The RF amplification device of claim 1 wherein the thermal sense element is configured such that the sense current level is adjusted based solely on the thermal conduction from the RF amplification circuit.

3. The RF amplification device of claim 1 wherein:
   the RF amplification circuit is configured to be heated in accordance with the current magnitude, such that a temperature of the RF amplification circuit is substantially directly proportional to the current magnitude; and
   the thermal sense element is configured such that the sense current level of the sense current is set by the thermal conduction from the RF amplification circuit such that the sense current level is substantially directly proportional to the temperature of the RF amplification circuit.

4. The RF amplification device of claim 1 wherein the feedback circuit is not electrically coupled to receive a feedback signal that is indicative of the current magnitude of the RF signal current from the RF amplification circuit.

5. The RF amplification device of claim 1 wherein the current magnitude is a root mean squared current magnitude.

6. The RF amplification device of claim 1, further comprising a semiconductor substrate wherein:
   the RF amplification circuit is formed on the semiconductor substrate; and
   the thermal sense element is formed on the semiconductor substrate so as to be positioned such that the thermal conduction in the semiconductor substrate from the RF amplification circuit sets the sense current level of the sense current.

7. The RF amplification device of claim 1 wherein the feedback circuit further comprises:
   a reference voltage circuit configured to generate a reference voltage; and
   the thermal sense element comprises a transistor configured to generate the sense current from the reference voltage, and positioned such that the thermal conduction from the RF amplification circuit sets the sense current level of the sense current with the sense current level indicative of the current magnitude of the RF signal current.

8. The RF amplification device of claim 7 wherein:
   the transistor comprises a base, a collector, and an emitter; and
   the collector is coupled to the reference voltage circuit such that the transistor generates the sense current from the reference voltage as a collector current.

9. The RF amplification device of claim 8 wherein the collector and the base are coupled such that the transistor operates in a diode mode.

10. The RF amplification device of claim 9 wherein the emitter is coupled to ground.

11. The RF amplification device of claim 8 wherein:
    the feedback circuit is further configured to generate a control signal; and
    the base of the transistor is coupled to receive the control signal.

12. The RF amplification device of claim 1 wherein, so that the feedback circuit is operable to decrease the current magnitude to or below the current magnitude limit, the thermal sense element is further configured to decrease the current magnitude to or below the current magnitude limit in response to the sense current level of the sense current reaching the trigger current level.

13. The RF amplification device of claim 12 wherein the feedback circuit further comprises a reference voltage circuit configured to generate a reference voltage, and wherein the thermal sense element is configured to:
    receive the reference voltage;
    generate a bias voltage having a bias voltage level such that the bias voltage level is substantially constant while the sense current level is below the trigger current level;

provide the bias voltage to the RF amplification circuit so that the bias voltage level of the bias voltage sets a quiescent operating voltage level of the amplified RF signal; and decrease the bias voltage level of the bias voltage in response to the sense current level of the sense current reaching the trigger current level so as to lower the quiescent operating voltage level in order to decrease the current magnitude of the RF signal current to or below the current magnitude limit.

14. The RF amplification device of claim 13 wherein:
the feedback circuit is further configured to generate a bias control signal having a bias control signal level;
the thermal sense element comprises a transistor having a base, an emitter, and a collector, wherein:
the collector is coupled to receive the reference voltage such that the sense current is generated as a collector current;
the base is coupled to receive the bias control signal; and
the transistor generates the bias voltage at the emitter, wherein the bias voltage level is adjustable by adjusting the bias control signal level of the bias control signal.

15. The RF amplification device of claim 1 wherein the feedback circuit further comprises a bias voltage generation circuit, wherein the bias voltage generation circuit is configured to:
generate a bias voltage having a bias voltage level;
provide the bias voltage to the RF amplification circuit such that a quiescent operating voltage level of the amplified RF signal is set in accordance with the bias voltage level of the bias voltage; and
decrease the bias voltage level of the bias voltage in response to the sense current level of the sense current reaching the trigger current level so as to lower the quiescent operating voltage level and decrease the current magnitude of the RF signal current below the current magnitude limit.

16. The RF amplification device of claim 1 wherein:
the RF amplification circuit includes an attenuator, wherein the attenuator has an attenuation level and is configured to:
adjust the current magnitude of the amplified RF signal in accordance with the attenuation level; and
adjust the attenuation level in accordance with an attenuation control signal level of an attenuation control signal; and
the feedback circuit comprises an attenuation control circuit, wherein the attenuation control circuit is configured to:
generate the attenuation control signal having the attenuation control signal level;
provide the attenuation control signal to the attenuator; and
adjust the attenuation control signal level in response to the sense current level of the sense current reaching the trigger current level so as to increase the attenuation level of the attenuator and decrease the current magnitude of the RF signal current to or below the current magnitude limit.

17. The RF amplification device of claim 1 wherein:
the RF amplification circuit has an amplifier gain and is configured to amplify the RF input signal in accordance with the amplifier gain so as to generate the amplified RF signal; and
the feedback circuit is configured to adjust the amplifier gain of the RF amplification circuit in response to the sense current level of the sense current reaching the trigger current level so as to decrease the current magnitude of the RF signal current to or below the current magnitude limit.

18. The RF amplification device of claim 1 further comprising:
an array of transistors comprising a first transistor and a set of transistors;
the RF amplification circuit including the set of transistors, wherein each one of the set of transistors is coupled to provide amplification to the RF input signal so as to generate the amplified RF signal; and
the thermal sense element comprising the first transistor, wherein the first transistor is configured to generate the sense current and, by being positioned in the array of transistors, the first transistor is positioned such that the thermal conduction from the RF amplification circuit sets the sense current level of the sense current as being indicative of the current magnitude of the RF signal current.

19. The RF amplification device of claim 18 wherein the first transistor is not coupled to provide amplification to the RF input signal.

20. The RF amplification device of claim 18, further comprising a semiconductor substrate wherein the array of transistors is formed on the semiconductor substrate.

21. The RF amplification device of claim 18 wherein:
the set of transistors comprises a set of collectors, the collectors being coupled to one another so that each transistor of the set of transistors provides amplification to the amplified RF signal;
the feedback circuit further comprises a reference voltage circuit configured to generate a reference voltage; and
the first transistor having a collector, wherein:
the collector of the first transistor is uncoupled from the set of collectors of the set of transistors; and
the collector of the first transistor is coupled to the reference voltage circuit so that the sense current is generated from the reference voltage as a collector current of the first transistor.

22. The RF amplification device of claim 21 wherein the first transistor further comprises a base coupled to the collector so that the first transistor operates in a diode mode.

23. The RF amplification device of claim 21, further comprising:
a load uncoupled from the set of transistors;
the array of transistors further comprising a second transistor, the second transistor having a collector and a base, wherein the base of the second transistor is coupled to receive the RF input signal and the collector of the second transistor is coupled to the load so that a comparison current is generated as a collector current of the second transistor, wherein the comparison current operates at the trigger current level; and
the feedback circuit comprising a comparison circuit configured to compare the sense current and the comparison current and decrease the current magnitude to or below the current magnitude limit in response to the sense current level of the sense current reaching the trigger current level.

24. A method of limiting a radio frequency (RF) signal current, comprising:
amplifying an RF input signal so as to generate an amplified RF signal that provides the RF signal current with a current magnitude and heat in accordance with the current magnitude of the RF signal current;
generating a sense current having a sense current level;

setting the sense current level of the sense current such that thermal conduction provided by the heat sets the sense current level of the sense current and such that the sense current level reaches a trigger current level in response to the current magnitude of the RF signal current being above a current magnitude limit; and decreasing the current magnitude to or below the current magnitude limit in response to the sense current level of the sense current reaching the trigger current level.

25. The method of claim 24 wherein:

amplifying the RF input signal so as to generate the amplified RF signal occurs during a transmission burst of the RF input signal; and decreasing the current magnitude to or below the current magnitude limit comprises decreasing the current magnitude by a discrete amount during a time window of the transmission burst.

26. The method of claim 24, further comprising:

generating a comparison current that sets the trigger current level;

comparing the sense current to the comparison current; and decreasing the current magnitude to or below the current magnitude limit as a result of the sense current being compared to the comparison current when the sense current level is above the trigger current level.

27. The method of claim 26 wherein:

amplifying the RF input signal so as to generate the amplified RF signal occurs during a transmission burst of the RF input signal; and comparing the sense current to the comparison current occurs throughout the transmission burst.

\* \* \* \* \*

UNITED STATES PATENT AND TRADEMARK OFFICE
CERTIFICATE OF CORRECTION

PATENT NO. : 9,035,701 B2
APPLICATION NO. : 13/593067
DATED : May 19, 2015
INVENTOR(S) : Derek Schooley et al.

Page 1 of 1

It is certified that error appears in the above-identified patent and that said Letters Patent is hereby corrected as shown below:

In the Specification

In column 15, lines 38 and 53, replace "$b_{12}$-$b_{12}$" with --$b_1$-$b_{12}$--.

Signed and Sealed this
First Day of September, 2015

Michelle K. Lee
*Director of the United States Patent and Trademark Office*